United States Patent [19]

Liu

[11] Patent Number: 5,267,125
[45] Date of Patent: Nov. 30, 1993

[54] FLEXIBLE GROUNDING ELEMENT

[75] Inventor: Morgan C. Liu, Taoyuan, Taiwan

[73] Assignee: Enlight Corporation, Taiwan

[21] Appl. No.: 958,305

[22] Filed: Oct. 8, 1992

[51] Int. Cl.⁵ .................... H05K 9/00; H05K 5/02; H01R 23/68; H01R 4/66
[52] U.S. Cl. .................................. 361/816; 439/95; 174/51; 24/293; 24/453; 361/789
[58] Field of Search .............. 361/424, 399, 412, 413; 174/35 R, 35 MS, 35 GC, 51; 24/293, 453; 439/101, 102, 103, 105, 108, 109, 92, 95

[56] References Cited

U.S. PATENT DOCUMENTS

| | | |
|---|---|---|
| 1,978,087 | 10/1934 | Johnson . |
| 2,041,336 | 5/1936 | Hall . |
| 2,137,210 | 11/1938 | Lombard ........................... 411/446 |
| 4,495,380 | 1/1985 | Ryan et al. ........................ 24/453 |
| 5,138,529 | 8/1992 | Colton et al. ..................... 361/424 |

Primary Examiner—Leo P. Picard
Assistant Examiner—Bot Ledynh
Attorney, Agent, or Firm—Ladas & Parry

[57] ABSTRACT

A flexible grounding element comprises a rectangular base portion, and a pair of side portions extending obliquely and upward from the edges of the base portion. Each of the side portions includes a pair of slots at the intermediate portion of its edges. One of the side portions bends toward the other one of the side portions at the location adjacent to the slot to form a bend portion. The front end of the bend portion bends upward to form an end portion which contactably touches the inner side of the other side portion. As the side portions are being pressed, a portion of each side portion will pass through the hole of a mother board, and as the side portions are released, the slots thereof will urge against the inner rim of the hole to effect positioning. Furthermore, each corner of the base portion has a flexible plate which includes a protrusion at the bottom thereof. After the flexible grounding element has been inserted into the mother board, the base portion will urge against the surface of the base plate, thereby exerting a compressive force on the protrusions of the flexible plates. The flexible plates will be urged to bend upward and the resulted counter force will force the flexible grounding element to firmly engage between the mother board and base plate.

4 Claims, 5 Drawing Sheets

FLEXIBLE GROUNDING ELEMENT

BACKGROUND OF THE INVENTION

The present invention relates to a flexible grounding element, in particular one which may be readily and simply inserted into the mother board of a computer so as to contact the base plate thereof to form a conductive passage between the mother board and the base plate, thereby preventing the problem of electro-magnetic interference.

It is known that various electrical appliances are composed of considerable amount of electronic elements. Under operation, the electronic elements will produce electromagnetic waves which radiate outward. If the electromagnetic waves are dispersed at random, other devices which also transmit signals by means of electromagnetic waves will be under interference in receiving. This is the so-called electro-magnetic interference. For example, televisions, radios and audio equipments will receive distorted signals if they are being influenced by the operation of other electrical appliances or the ignition of automobiles or motorcycles outdoors. Therefore, it is important to find a way in preventing electro-magnetic interference effectively in research.

Recently, computer has become an indispensable tool in our life. This is why tremendous efforts have been put on the designing of the computer to improve its operation. As far as the electro-magnetic interference induced by the computer is concerned, the problem becomes severe upon those computers that operate at very high speed and having high frequencies. Therefore, in most of the developed countries, the computers are tested under strict requirements such that the influence caused by electromagnetic waves is minimized.

To overcome the electro-magnetic interference in personal computer, it is known to overcome the problem by grounding the mother board of the computer. That is, a plurality of holes are provided on the mother board, and a plurality of fixation seats corresponding to the holes are disposed on the base plate of a computer. The mother board is then fixed to the base plate by means of screws to attain the purpose of grounding. However, such a method is complicated and uneconomical, and it is inconvenient to the dismounting and mounting of the mother board. Therefore, it is essential to design a grounding device which may be simply and readily mounted onto the mother board of a computer, and which may connect the mother board to the base plate to form a conductive passage, thereby diminishing the electromagnetic interference.

SUMMARY OF THE INVENTION

The primary object of the invention is to provide a flexible grounding element comprising a rectangular base portion, and a pair of side portions extending obliquely and upward from the edges of the base portion. Each of the side portions includes a pair of slots. As the side portions are being pressed, the top end of each side portion will pass through the hole of a mother board, and as the side portions are released, the slots thereof will urge against the inner rim of the hole to effect positioning. As the base portion of the grounding element is urged against the base plate of the computer, a conductive passage will be formed between the mother board and the base plate.

The other object of the invention is to provide a flexible grounding element in which each corner of the base portion includes a flexible plate having a protrusion at the bottom thereof. After the flexible grounding element has been inserted into the mother board, the base portion will urge against the base plate, thereby exerting a compressive force on the protrusions of the flexible plates. The flexible plates will be urged to bend upward and the resulted counter force will force the flexible grounding element to engage more firmly between the mother board and base plate.

A further object of the invention is to provide a flexible grounding element which having been inserted into the mother board, the flexible plates thereof may be slid in a parallel fashion into the seat of the base plate formed by punching so as to accomplish the positioning between the mother board and base plate. In this manner, the inconvenience caused in conventional method of fixing the mother board to the base plate by means of screws may be avoided.

These and other objects, advantages and features of the present invention will be more fully understood and appreciated by reference to the written specification.

DETAILED DESCRIPTION OF THE INVENTION

Figure 1:
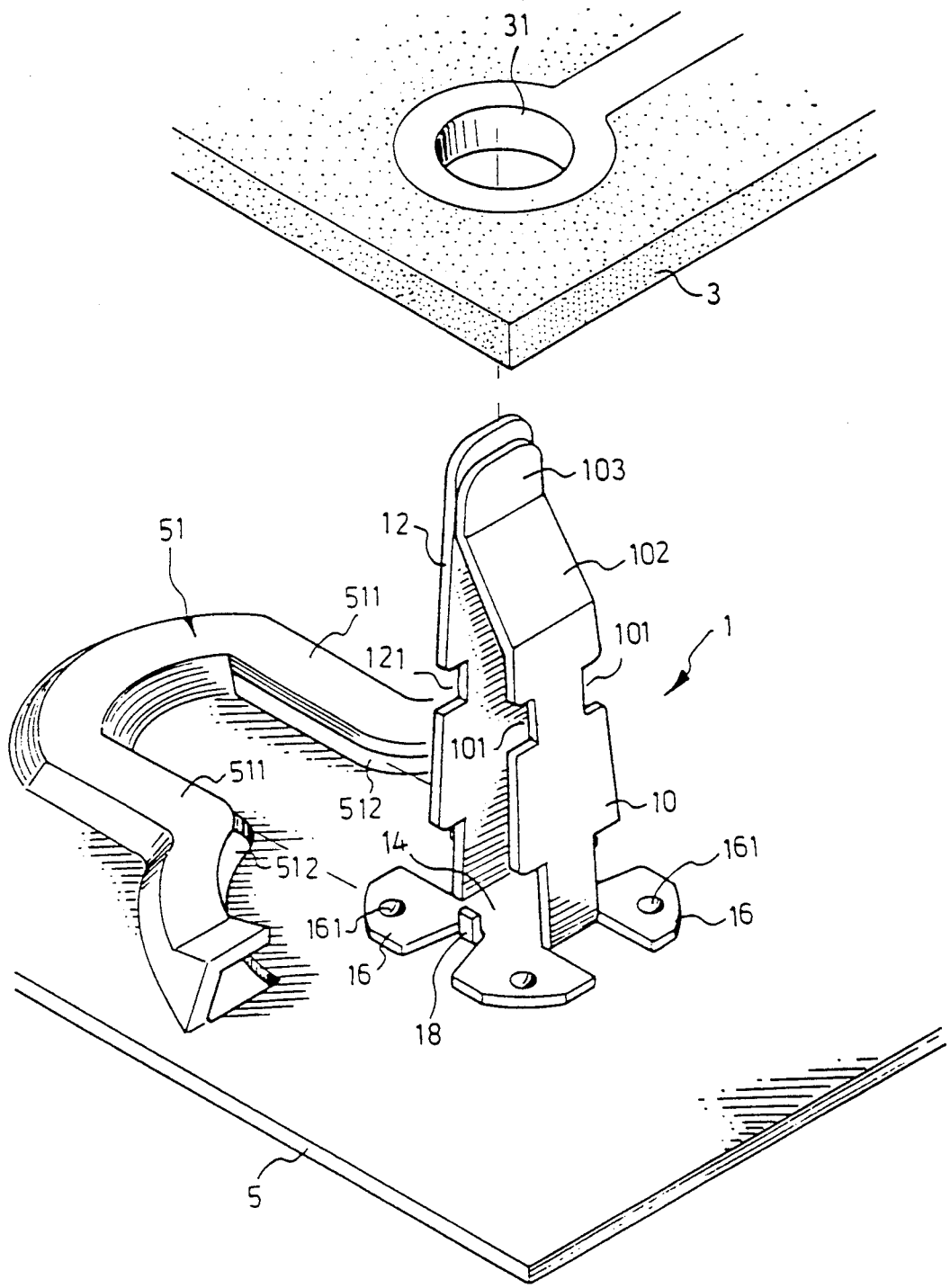
FIG. 1 is a perspective view illustrating a flexible grounding element in accordance with the present invention being separated from the mother board and base plate of a computer.
Figure 2:
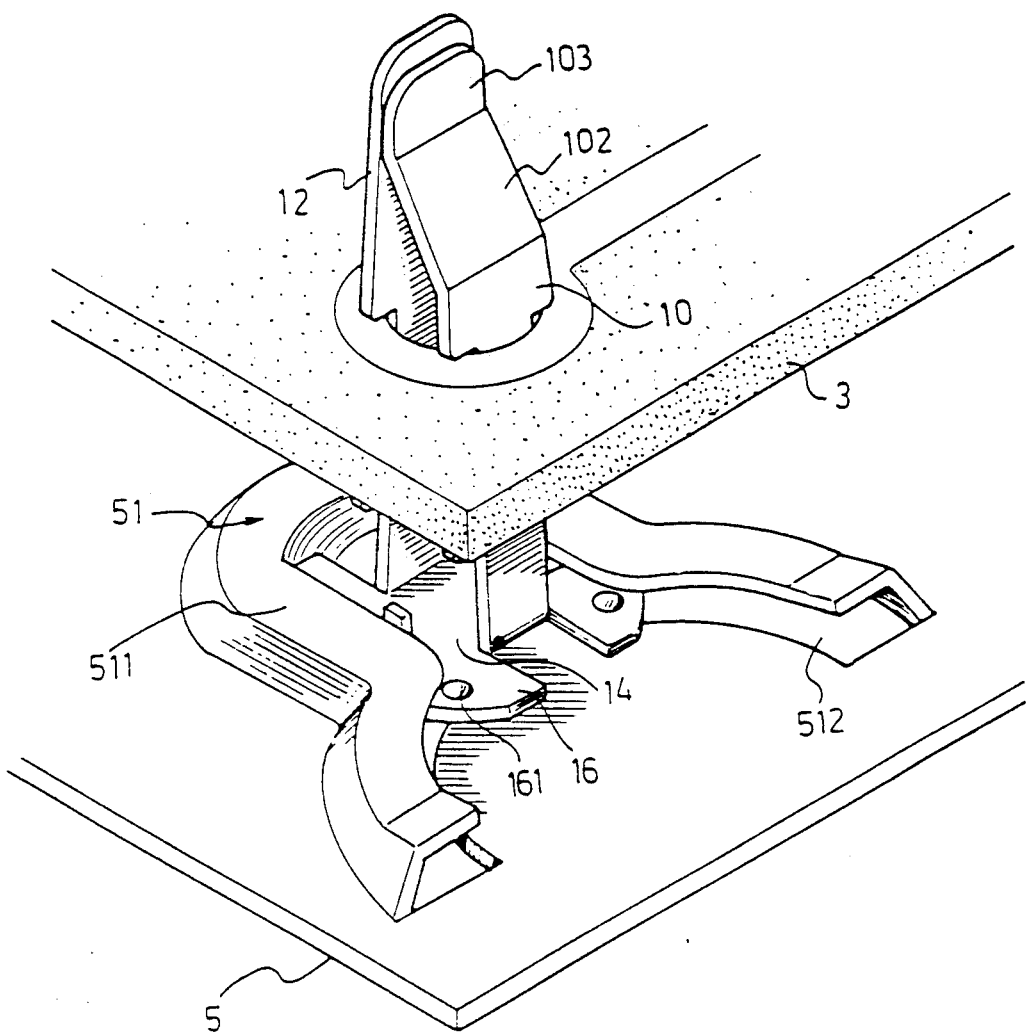
FIG. 2 is a perspective view illustrating a flexible grounding element in accordance with the present invention being positioned between the mother board and the base plate.

With reference to FIGS. 1 and 2, a flexible grounding element 1 according to the present invention comprises a rectangular base portion 14 and a pair of side portions 10 and 12 extending obliquely and upward from the edges of the base portion 14. Each of the side portions 10, 12 includes a pair of slots 101 and 121 at the intermediate portion of its edges. The side portion 10 bends toward the other side portion 12 at the location adjacent to the slot 101 to form a bend portion 102. The front end of the bend portion 102 bends upward to form an end portion 103 which contactably touches the inner side of the side portion 12. Furthermore, each corner of the base portion 14 has a flexible plate 16 which extends horizontally therefrom. Each of the flexible plates 16 includes a protrusion 161 at the bottom thereof. Besides, a pair of lugs 18 perpendicular to the base portion 14 are disposed at both edges of the base portion 14 between two side portions 10 and 12.

The flexible grounding element 1 in accordance with the present invention is disposed between the mother board 3 and base plate 5 of a computer (not shown). The mother board 3 has a plurality of circular holes 31 for receiving the flexible grounding elements 1. Seats 51 are located on the base plate 5 at locations corresponding to the circular holes 31. The seat 51 is formed by punching and is substantially in the shape of a slot to facilitate the positioning of the flexible grounding element 1.

Figure 3:
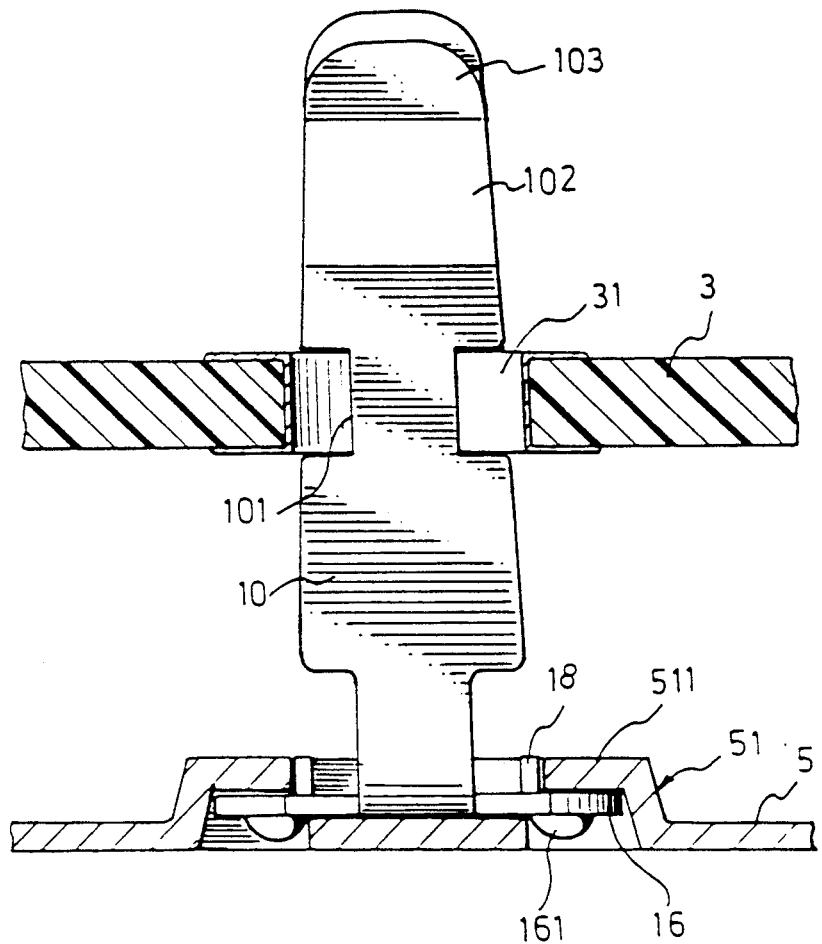
FIG. 3 is a front, cross-sectional view flexible grounding element in accordance with the present invention in its fixed status.
Figure 4:
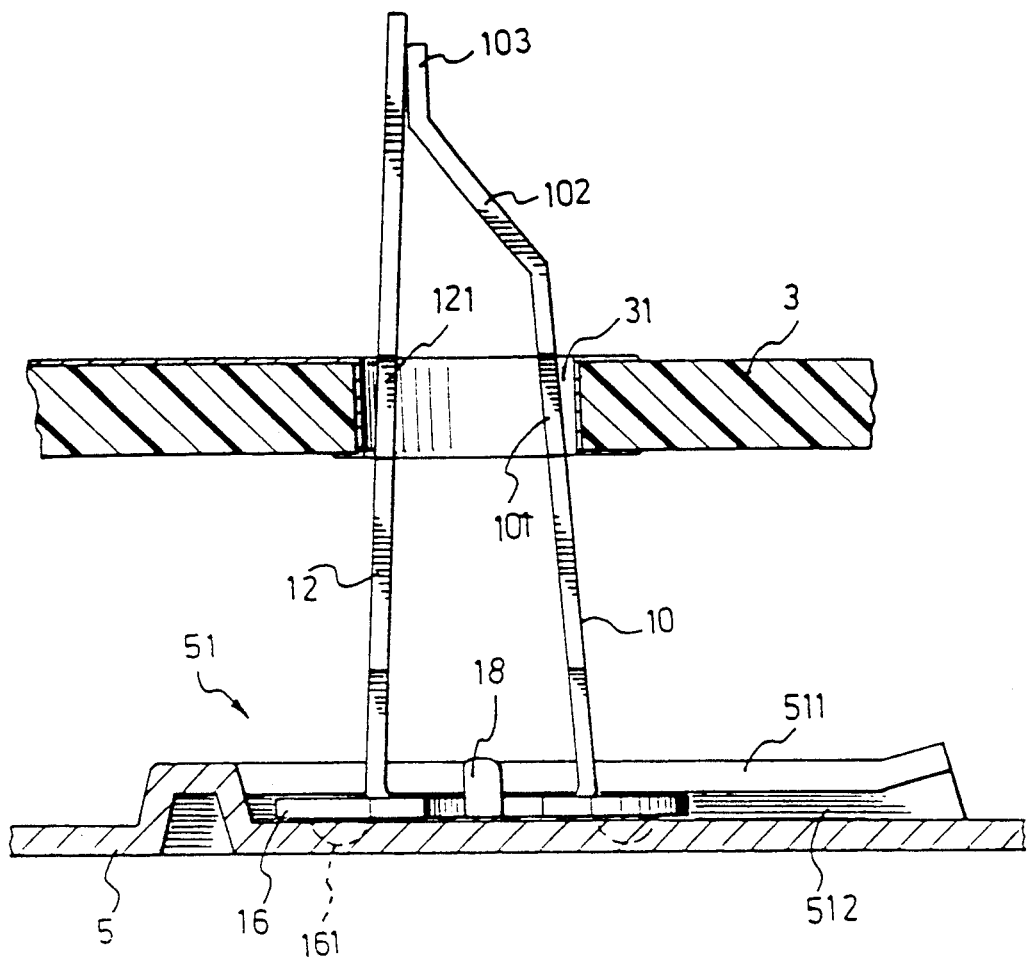
FIG. 4 is a side, cross-sectional view of a flexible grounding element in accordance with the present invention in its fixed status.

During the mounting of the flexible grounding element 1 (see FIGS. 3 and 4), side portions 10 and 12 should be pressed first so that a portion of each side portion passes through the hole 31 of the mother board 3. The side portions 10, 12 are then released so that the slots 101, 121 thereof urge against the inner rim of the circular hole 31. In this manner, the flexible grounding element 1 will engage with the mother board 3. Having inserted the flexible grounding element 1 into the mother board 3, the flexible plates 16 may then be slid in a parallel manner into the seat 51 of the base plate 5. That is to say, the flexible plates 16 are placed in the clearances 512 formed between the base plate 5 and the edges 511 of the seat 51. The lugs 18 of the flexible grounding element 1 are disposed to urge against the edge 511 so that the lugs 18 may serve in guiding the flexible grounding element 1, thereby facilitating the sliding movement. Therefore, the flexible grounding element 1 not only serves as a conductive passage connecting the mother board 3 and base plate 5, but also serves in accomplishing the positioning between the mother board 3 and base plate 5. To remove the mother board 3, it is only necessary to detach the flexible grounding element 1 from the seat 51 by drawing the combination parallelly in a reverse direction. Such a procedure is simple and easy.

In case further grounded points are needed without having to take the positioning of the mother board into consideration, it is only necessary to connect the flexible grounding element which is in engagement with the mother board to the base plate.

Figure 5:
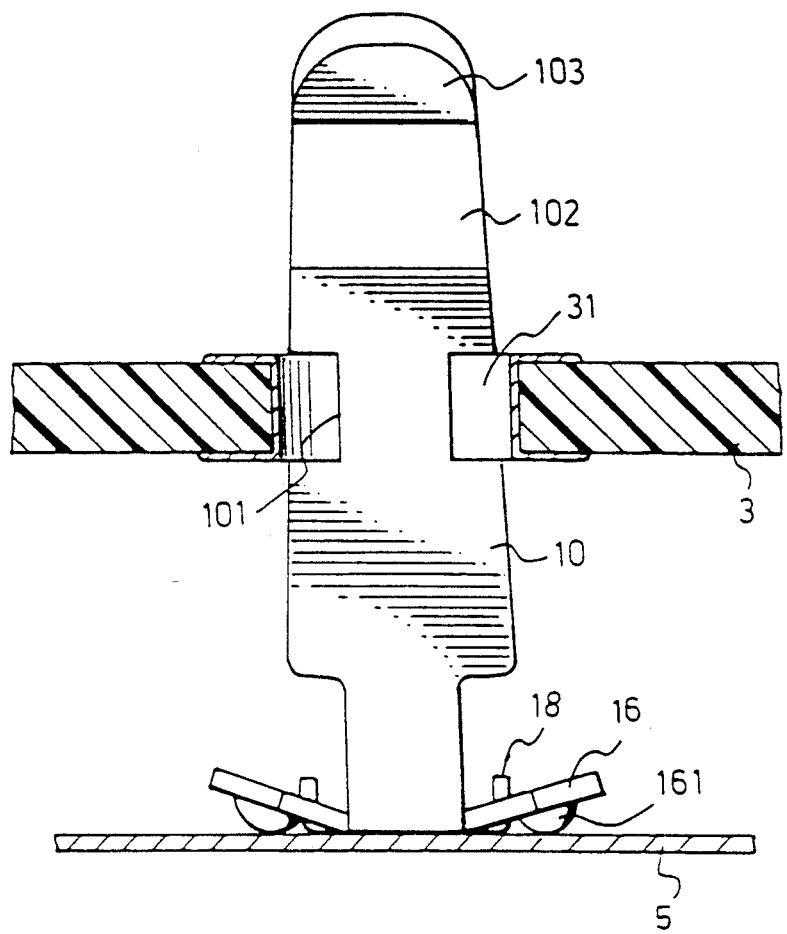
FIG. 5 is a front, cross-sectional view of a flexible grounding element in accordance with the present invention in its alternate fixed status.

With reference to FIG. 5, after the flexible grounding element 1 has been inserted into the mother board 3, the base portion 14 will urge against the surface of the base plate 5, thereby exerting a compressive force on the protrusions 161 of the flexible plates 16. The flexible plates 16 will be urged to bend upward and the resulted counter force will force the flexible grounding element to engage more firmly between the mother board 3 and base plate 5.

It is apparent that although the invention has been described in connection with a preferred embodiment, those skilled in the art may make changes to certain features of the preferred embodiment without departing from the spirit and scope of the invention as defined in the appended claims.

What is claimed is:

1. A flexible grounding element comprising:
    a base portion having at least a flexible plate at edges thereof; and
    a pair of side portions extending upward from the edges of said base portion, each of said side portions includes a pair of slots at both edges thereof;
    whereby pressing said side portions so that a portion of each side portion passes through a hole of a mother board, and as said side portions are released, said slots are urged against an inner rim of the hole to effect positioning.

2. A flexible grounding element as claimed in claim 1, wherein said flexible plate has a protrusion at a bottom surface thereof.

3. A flexible grounding element as claimed in claim 1, wherein said side portions are opposite to and extend obliquely toward each other, one of said side portions bends toward the other one of said side portions at a location adjacent to said slot to form a bend portion, and a front end of said bend portion bends upward to form an end portion which contactably touches an inner side of the other side portion.

4. A flexible grounding element as claimed in claim 1, wherein a pair of lugs perpendicular to said base portions are respectively disposed at both edges of said base portion between said side portions.

* * * * *